Jan. 14, 1964 I. F. BARDITCH 3,118,114

MONOLITHIC VARIABLE TUNING AMPLIFIER

Filed Feb. 8, 1960

WITNESSES

John E. Healey Jr.

James F. Young

INVENTOR

Irving F. Barditch

BY Maury I. Hull

ATTORNEY

United States Patent Office 3,118,114

Patented Jan. 14, 1964

3,118,114

MONOLITHIC VARIABLE TUNING AMPLIFIER

Irving F. Barditch, Baltimore, Md., assignor to Westinghouse Electric Corporation, East Pittsburgh, Pa., a corporation of Pennsylvania Filed Feb. 8, 1960, Ser. No. 7,477
10 Claims. (Cl. 330—38)

This invention relates to improvements in variable tuning amplifiers, and more particularly to a variable tuning amplifier including a plurality of low-pass filters which in one embodiment of the invention are tunable semiconductor elements. The variable tuning amplifier in one embodiment thereof is a monolithic semiconductor structure.

In the prior art, a number of methods of constructing tunable amplifiers have been employed. These may comprise such devices as a semiconductor delay line in a feedback amplifier, or an active delay amplifier enclosed in a feedback loop.

The apparatus of the instant invention makes use of distributed constant low-pass filters which in one embodiment of the invention are semiconductor wafers comprising reverse-biased p-n junctions which act electrically as a series R-shunt C-ladder type low-pass filter, and which can have the cutoff frequency electrically varied by changing the width of the depletion layer caused by the back-biasing of the junction. In summary, the apparatus employs two low-pass filters. The output of one of these low-pass filters is applied by way of a 180° phase shifting network to the input of this filter at a summing point in the input circuit. Only the low frequency components will pass through the low-pass filter and be amplified, and when these amplified signal components are fed back to the input, because they are of proper phase and amplitude, they will cancel partially and in varying amounts all components in the input signal that are in the filter's frequency band-pass, each frequency component in the input signal being partially cancelled to an extent inversely proportional to the attenuation of that particular frequency component in the low-pass filter, as determined by the frequency-vs.-attenuation characteristic thereof, and in accordance with the gain in the amplifier, so that a resultant signal taken from the summing point will appear as if it had passed through a high-pass filter. The resultant signal from the summing point is then passed through a second low-pass filter and amplified, thereby providing an implifier with a band-pass characteristic. The filter cutoff points can be electrically varied by changing the amplitude of the back-biasing potentials to the two p-n junctions of the two semiconductor low-pass filters.

One embodiment of the invention is a monolithic structure.

Accordingly, a primary object of the instant invention is to provide a new and improved variable tuning amplifier.

Another object is to provide a new and improved frequency selective amplifier employing only low-pass filter elements.

A further object is to provide a new and improved variable tuning amplifier of monolithic semiconductor construction.

Still a further object is to provide a new and improved variable frequency selective amplifier employing semiconductor materials.

These and other objects will become more clearly apparent after a study of the following specification when read in connection with the accompanying drawings, in which.

Figure 1:
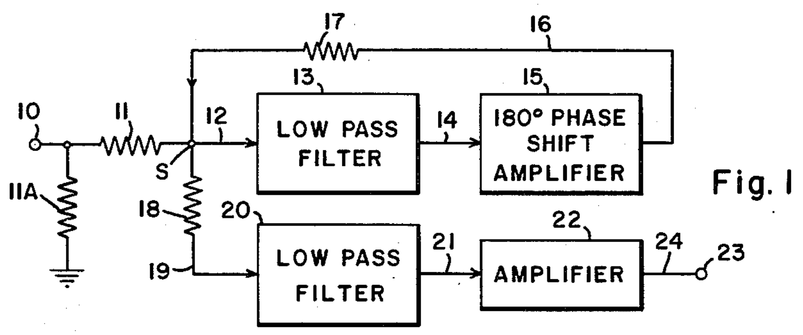
FIGURE 1 is an electrical circuit diagram in block form of one embodiment of the invention.

Referring now to the drawings, in which like reference numerals are used throughout to designate like parts, for a more detailed understanding of the invention, and in particular to FIG. 1 thereof, there is shown at 10 an amplifier input terminal to which an input signal which may contain all or a wide range of frequency components is supplied. Terminal 10 is connected by way of resistor 11 and lead 12 to the input of a first low-pass filter 13 and to ground by resistor 11A. Low-pass filter 13 may have a frequency-versus-amplitude characteristic such as that shown by curve A of FIG. 4. The output of low-pass filter 13 is applied by lead 14 to an amplifier 15 which produces a 180° phase shift, and the output of the phase shift amplifier 15 is applied by way of lead 16 and resistor 17 to lead 12 at a summing point S. Only the low frequency components pass with varying degrees of attenuation through the low-pass filter 13, and these components inverted 180° in phase at 15 when applied to the summing point S partially cancel all of the signal components that are in the filter's frequency band-pass, each frequency component in the input signal being partially cancelled to an extent inversely proportional to the attenuation of that particular frequency component in the low-pass filter, and in accordance with the gain of amplifier 15. The resultant signal taken from the summing point S and applied by way of resistor 18 and lead 19 to a second low-pass filter 20 will appear on lead 19 as if it had passed through a high-pass filter. Where the gain of amplifier 15 exceeds zero only to the amount necessary to compensate for loss in resistor 17, so that a 1:1 ratio exists between the input and output, the signal on lead 19 would appear ot have passed through a high-pass filter having a characteristic indicated by the curve B of FIG. 4, which it will be noted in substantially the inverse of curve A. The output of low-pass filter 20 is applied by way of lead 21 to an amplifier 22, the output of which is applied to the frequency selective amplifier output terminal 23.

Assume for purposes of explanation that the low-pass filter 20 has a characteristic similar to that of low-pass filter 13. The filter 20 in effect will pass a band of frequencies to its output lead 21, the frequency band being generally that enclosed by the portion *b'* of curve B and the portion *a'* of curve A, FIG. 4. It will be noted that at the point where curves A and B cross in FIG. 4, substantially 50% of any component of that frequency is cancelled at the summing point. If this signal having approximately 50 percent of its original amplitude is again passed through a low-pass filter having a characteristic corresponding to curve A, the peak amplitude of that frequency component passed by filter 20 to lead 21 will then be approximately 25% of the amplitude of the signal component of this frequency at terminal 10, and the total band-pass charateristic of the circuit, and its effect on the output on lead 21 is indicated by the curve D of FIG. 4. Losses of transmission in the various filters are compensated for by the amplifier 22, so that while the ultimate result at amplifier output terminal 23 may be a characteristic resembling the curve D, it is understood that amplified signals at 23 falling in the area of the frequency band-pass of curve D may readily exceed in absolute amplitude the signals applied to input terminal 10.

Figures 2, 3, 4:
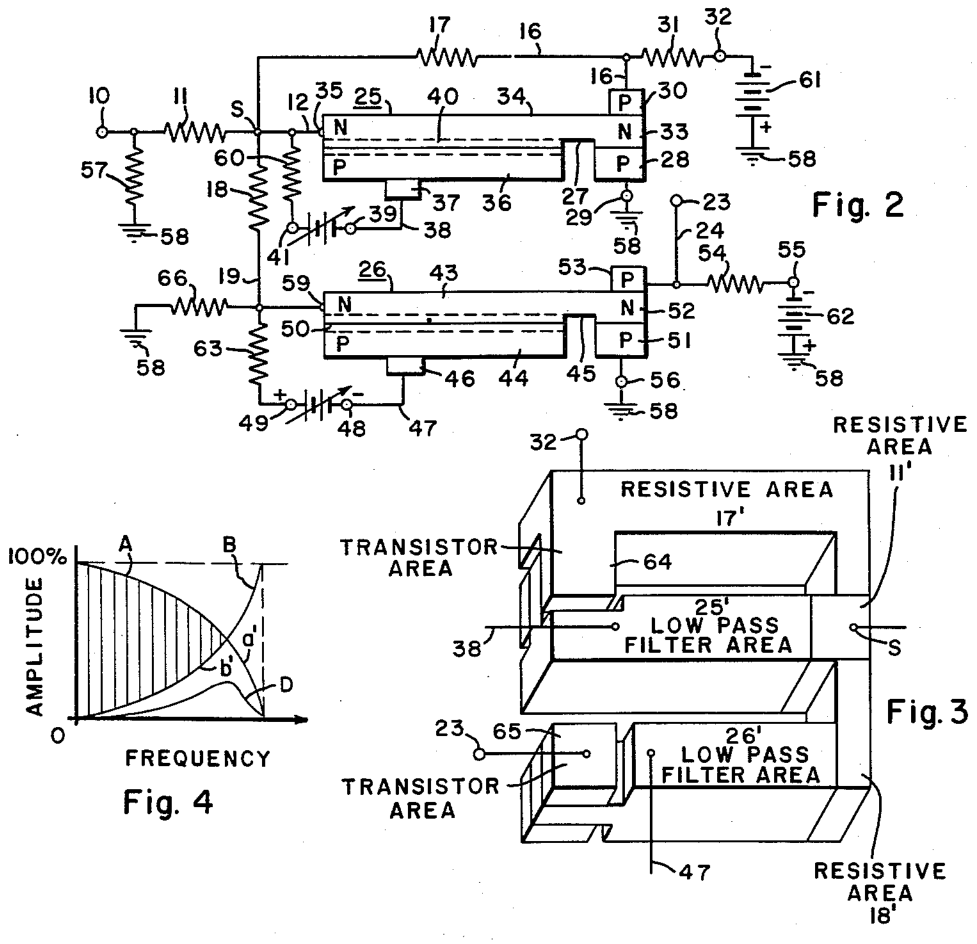
FIG. 2 is an electrical circuit diagram showing the embodiment of the invention utilizing semiconductor filter elements and semiconductor amplifiers.
FIG. 3 is a topological diagram of monolithic semiconductor apparatus embodying the invention.
FIG. 4 is a graph illustrating the operation of the apparatus of FIGS. 1, 2 and 3.

Particular reference is made now to FIG. 2 in which a first semiconductor structure generally designated 25 performs the functions of low-pass filter 13 and phase shift amplifier 15, whereas a second semiconductor structure generally designated 26 performs the functions of the low-pass filter 20 and amplifier 22. In this embodiment, lead 12 is connected by resistor 57 to ground 58 to provide a needed signal return path, as will become hereinafter apparent.

Semiconductor element 25 comprises a layer 34 of n-type semiconductivity adjacent a layer 36 of p-type semiconductivity and forming a p-n junction. Near one end of the structure a slot 27 is cut or etched into the element, the slot extending all of the way through the p-type layer 36 and a substantial distance into the n-type layer or region thereby producing a small portion 28 of p-type conductivity and a superimposed portion 33. On the surface of the n-type portion 33, there is disposed a second small layer 30 of semiconductor material having p-type semiconductivity forming a triode transistor portion 30—33—28 in the semiconductor element 25. The transistor portion or section is of conventional p-n-p variety in which the p-type emitter 28 is connected to terminal 29, and thence to ground 58 and the collector 30 of p-type material is connected by way of lead 16 and resistor 31 to terminal 32. Circuit means including a suitable source of direct-current energizing potential 61 is connected between terminal 32 and ground 58 to bias collector 30 in a reverse direction and bias emitter 28 in a forward direction. Intermediate the collector 30 and emitter 28 is the base portion 33 formed integrally with the layer of n-type material 34, the other end of the n-type layer 34 having an ohmic connection thereto at 35, the ohmic connection 35 being connected by the lead 12 to the aforementioned summing point S.

Adjacent the layer 34 of n-type material is the aforementioned layer 36 of p-type material having an ohmic connection 37 thereto connected by lead 38 to the negative terminal 39 of a suitable source of direct-current potential which is preferably of adjustable amplitude for applying a reverse bias to the p-n junction between layers 34 and 36 and causing the formation of a depletion layer 40 in the portions of the n-type layer and the p-type layer adjoining the junction. It will be readily understood that the depletion layer 40, being relatively devoid of carriers, acts as a dielectric whereas both the n-type layer and the p-type layer have a certain distributed resistance per unit length. By suitable choice of the strength of the doping impurities in layers 34 and 36, the reverse-biased p-n junction forms a low-pass filter portion of the series R-shunt C-ladder type which has a pass and cutoff characteristic determined by the values of the distributed resistance and distributed capacitance. The use of a reverse biased p-n junction as a low-pass filter has been described in the literature of the art. The positive terminal 41 of the source of potential which applies the reverse bias to the p-n junction 34—36 is suitably connected by isolating resistor 60 to lead 12, the resistor 60 insuring that the alternating-current signals of the circuit follow the desired paths. Accordingly, a signal applied to the semiconductor structure 25 by lead 12 in effect passes through a low-pass filter provided by the reverse biased p-n junction, is applied to the base 33 of the transistor portion, is amplified in the transistor portion of the semiconductor structure, and applied back by way of lead 16 and resistor 17 to the summing point S. From thence the resultant signal is applied by way of resistor 18, lead 19 and ohmic contact 59 to a second semiconductor structure generally designated 26 which may be similar to structure 25.

The structure 26 comprises a layer 43 of n-type material adjacent a p-type layer 44 and forming a p-n junction, the structure having a slot 45 at one end. The p-type layer 44 has an ohmic contact 46 connected by lead 47 to the negative terminal 48 of a suitable source of direct-current potential which is preferably of adjustable amplitude, the positive terminal 49 thereof being connected by resistor 63 to lead 19 to apply a reverse bias to the p-n junction 43—44 causing the formation of the depletion layer 50. At the right-hand end of the semiconductor structure 26 as viewed in FIG. 2, beyond the slot 45, there is a transistor section or portion including an emitter 51 of p-type material connected to terminal 56 and thence to ground 58, a base 52 formed integrally with the aforementioned n-type layer 43, and a collector 53 of p-type semiconductor material connected by way of lead 24 to the amplifier output terminal 23, collector 53 also being connected by way of resistor 54 to the terminal 55. Circuit means including a suitable source of direct-current energizing potential 62 is connected between terminal 55 and ground 58 for biasing collector 53 in a reverse direction and biasing emitter 51 in a forward direction. A resistor 66 is preferably connected from lead 19 to ground 58.

The operation of the semiconductor device 26 is similar to that of the aforedescribed device 25. The reverse bias applied to the p-n junction 43—44 causes formation of a depletion layer 50, and the distributed resistance and distributed capacitance form a low-pass filter having the characteristic thereof determined by the circuit parameters. The characteristic of the filter may be varied by varying the direct-current potential applied between terminals 49 and 48. The output of this filter is amplified by the transistor section 51—52—53 and applied to amplifier output terminal 23.

If desired, leads 38 and 47 may be connected to ground 58, when it is desired to extend the low frequency limit of operation of the apparatus, suitable revision of component values including those of resistors 60 and 63 being made, in a manner which will be apparent to those skilled in the art.

Particular reference should be made now to FIG. 3 which is a topological diagram of a monolithic semiconductor structure in which the resistors of the circuit of FIG. 2 are included in one body of semiconductor material. Intrinsic semiconductor material may be used to provide high resistance, and such intrinsic material may be doped in a controlled manner to provide within a wide range any desired value of lower resistance per unit length or unit volume.

In FIG. 3, the areas designated transistor area 64 and transistor area 65 perform the functions of the two transistors or transistor portions or sections shown in FIG. 2, transistor area 64 corresponding to the transistor portion or section comprising elements 28, 33 and 30 of FIG. 2, and transistor area 65 corresponding to the transistor portion or section comprising elements 51, 52 and 53 of FIG. 2. The low-pass filter areas in FIG. 3 designated 25′ and 26′, respectively, comprise p-n junctions corresponding to the portions or sections of the semiconductor structures 25 and 26 in which depletion layers are formed and which are used as low-pass filters. Resistive areas 17′, 11′ and 18′ of the structure of FIG. 3 have the functions of resistors 17, 11 and 18 of FIGS. 1 and 2. The leads 38 and 47 of FIG. 3 correspond to the leads 38 and 47 of FIG. 2 for applying erverse biasing potentials of adjustable amplitudes to vary the characteristics of the low-pass filters. A direct-current supply terminal 32 is shown connected to the resistive area 17′ of FIG. 3 adjacent the transistor area 64, and it will be understood that an additional energizing supply lead corresponding to the lead to terminal 29 may be taken to the transistor area 64.

In like manner, leads, not shown, are taken to transistor area 65 for biasing the collector and emitter. The invention includes suitable ground connections, if desired, to the structure of FIG. 3. The monolithic structure of FIG. 3 is well suited for construction by techniques available in the present state of the art including etching, drilling, plating, diffusing, and so forth. It is contemplated that intrinsic semiconductor material may, if desired, fill the spaces in the structure of FIG. 3. Likewise resistive areas in the structure of FIG. 3 performing the functions of resistors 57, 66, 60, 63, 31 and 54 of FIG. 2 are contemplated, if desired.

There has been provided, then, a tunable band-pass amplifier well suited to accomplish the aforedescribed objects of the invention. Furthermore, the amplifier is especially suitable for monolithic construction and the employment of semiconductor material(s).

If desired, bias batteries may be added in series with resistors 57 and 66, FIG. 2, to alter the operating points of the transistors, and/or alter the gain of the transistor sections.

If desired, resistance voltage dividing networks, not shown, can be connected between terminal 32 and ground, and between terminal 55 and ground, and the low potential ends of resistors 57 and 66 be connected to selected points on the networks, respectively, the points preferably being by-passed to ground. It will be apparent that the resistance networks, and all resistors in FIG. 2 may be made part of the monolithic structure of FIG. 3.

In the description of FIG. 3, and in the claims, the word "area" is used in a three-dimensional sense.

Whereas the invention has been shown and described with reference to some embodiments thereof which give satisfactory results, it should be understood that changes may be made and equivalents substituted without departing from the spirit and scope of the invention.

I claim as my invention:

1. A band-pass amplifier comprising, in combination, input lead means for an input signal to be amplified, first low-pass filter means having the input signal on the input lead means applied thereto, phase shift amplifier means operatively connected to the first low-pass filter means and having the output of the first low-pass filter means applied thereto, said phase shift amplifier means being operatively connected to said input lead means and feeding back the amplifier means output signal as a feedback signal to said input lead means, second low-pass filter means operatively connected to said input lead means, said second low-pass filter means having applied thereto a signal corresponding to the sum of the input signal and the feedback signal, and means for obtaining an amplifier output from the second low-pass filter means.

2. A tunable band-pass amplifier suitable for monolithic semiconductor construction comprising, in combination, input lead means, first low-pass filter means having the signal on the input lead means applied thereto and including first semiconductor means forming a reversed biased p-n junction with a depletion layer therein, phase shift amplifier means operatively connected to the first low-pass filter means and energized by the output of the first low-pass filter means, said phase shift amplifier means being operatively connected to said input lead means to apply the output thereof to said input lead means whereby the output is summed with the input signal on the input lead means to form a resultant signal, and second low-pass filter means having the resultant signal applied thereto, the second low-pass filter means including second semiconductor means forming an additional reverse biased p-n junction with a depletion layer therein, said first low-pass filter means and said second low-pass filter means including means for varying the potentials of the reverse biases applied thereto to vary the thickness of the depletion layers in the first and second semiconductor means and thereby vary the distributed capacitance in the first and second filter means and vary the frequency response characteristics of the first and second filter means.

3. A tunable band-pass amplifier according to claim 2 including in addition amplifier means for the output of the second low-pass filter means.

4. A tunable band-pass amplifier suitable for monolithic semiconductor construction including input lead means, a first semiconductor structure operatively connected to the input lead means, said first semiconductor structure having a p-n junction section and means for applying a reverse bias to the p-n junction to create a depletion layer adjacent the p-n junction providing distributed capacitance to form a first low-pass filter of the p-n junction section, the input signal on the input lead means being applied to the first low-pass filter, said first semiconductor structure including a first transistor section for amplifying and reversing the phase of the output of the first filter section, resistance means coupling the output of the first transistor section to the input lead means to provide a resultant summed signal on the input lead means, and a second semiconductor structure including a p-n junction section with means for applying a reverse bias to the last-named p-n junction to create a depletion layer in the p-n junction section and form a second low-pass filter in the second semiconductor structure, the resultant summed signal being applied to the second low-pass filter as an input, said second semiconductor structure including a second transistor section for amplifying the output of the second low-pass filter, the first and second filter sections and first and second transistor sections providing a band-pass amplifier having a frequency response under the control of the amplitudes of the reverse biases applied to the p-n junctions of the first low-pass filter section and second low-pass filter section.

5. A monolithic semiconductor band-pass amplifier including a first resistive area having the input signal to be amplified applied thereto, an adjacent area forming a first low-pass filter and having the input signal applied thereto, said first low-pass filter area including a reversed biased p-n junction having a depletion layer providing distributed capacitance for the low-pass filter, a first transistor amplifier area adjacent the first low-pass filter area for amplifying and reversing the phase of the output of the first low-pass filter, an additional resistive area coupling the output of the first transistor amplifier area to the first resistive area whereby the output of the first transistor amplifier is summed with the input signal to provide a resultant signal, a second low-pass filter area including a reversed biased p-n junction, another resistive area coupling the first resistive area to the second low-pass filter area for applying the resultant signal as an input to the second low-pass filter, and a second transistor amplifier area adjacent to the second low-pass filter area for amplifying the output of the second low-pass filter, the output of the first transistor amplifier when summed with the input signal providing a resultant signal having a frequency vs. attenuation characteristic similar to that provided by a high-pass filter, said resultant signal when passed through the second low-pass filter providing an amplifier band-pass characteristic.

6. A tunable band-pass amplifier suitable for monolithic semiconductor construction comprising, in combination, input lead means including summing lead means, first semiconductor means, said first semiconductor means including a first p-n junction section, means connected to said p-n junction section for applying a reverse bias to the p-n junction creating a depletion layer and providing a first low-pass filter, the input signal being applied to the first low-pass filter, said first semiconductor means including a transistor amplifier section for amplifying and reversing the phase of the output of the first low-pass filter, means coupling the output of the first transistor amplifier to said summing lead means to provide a resultant signal at the summing lead means having a frequency vs. attenuation characteristic similar to that of a signal passed through a high-pass filter, second semiconductor means including a second p-n junction section, means for applying a reverse bias to the second p-n junction section to cause the formation of a depletion layer therein and provide a second low-pass filter, and means for applying the resultant signal as an input to the second low-pass filter, said second semiconductor means having a second transistor amplifier section for amplifying the output of the second low-pass filter, the output of the second transistor amplifier section having a band-pass frequency response characteristic variable in accordance with variations in the reverse biases on the first and second p-n junctions.

7. A tunable band-pass amplifier of monolithic semiconductor structure consisting of a first filter area including a first p-n junction, the first p-n junction being adapted to have a reverse bias of adjustable amplitude applied thereto to create a first depletion layer and provide the effect of a first low-pass filter, the input signal to be amplified being applied to the first low-pass filter, the monolith including a transistor area for amplifying and reversing the phase of the output of the first low-pass filter, an area for summing the amplified output after phase reversal with the input signal to provide a resultant signal, a second filter area including a second p-n junction, the second p-n junction being adapted to have a reverse bias of adjustable amplitude applied thereto to provide a second low-pass filter, the resultant signal being applied to the second low-pass filter as an input, and another transistor area for amplifying the output of the second low-pass filter, said monolithic semiconductor structure providing an amplifier with a band-pass characteristic adjustable in accordance with changes in the values of the reverse biases applied to the first and second p-n junctions.

8. A semiconductor monolith element constituting an overlapping high pass and low pass signal translation channel, said element comprising, an input means, a first low pass filter area connected to said input means, a transistor amplifier area having its input connected to said filter area and having its output connected to said input means, a second low pass filter area having its input connected to said input means, whereby the resultant signal applied to said second low-pass filter area is similar to that which would have resulted had the input signal been passed through a high-pass filter.

9. A semiconductor monolith element constituting an overlapping high-pass and low-pass signal translation channel, said element comprising, an input means, a first low-pass filter area connected to said input means, a transistor amplifier area having its input connected to said filter area and having its output connected to said input means, a second low pass filter area having its input connected to said input means, whereby the resultant signal applied to said second low pass filter area is similar to that which would have resulted had the input signal been passed through a high pass filter, and a second transistor amplifier area having its input connected to said second low-pass filter output.

10. As a new article of manufacture, a semiconductor monolith element comprising input means, a first low-pass filter area having its input connected to said input means and including first semiconductor area forming a reversed biased p-n junction with a depletion layer therein, a phase shift amplifier area operatively connected to said first low pass filter area, said amplifier area output operatively connected to said input means to apply the output thereof to said input means whereby the output is summed with the input signal applied to said input means to form a resultant signal, second low-pass filter area having its input connected to said input means, said second low pass filter means including second semiconductor means forming an additional reverse bias p-n junction with a depletion layer therein, said first low pass filter area and said second low-pass filter area being adapted to be connected to means for varying the potentials of the reverse bias applied thereto to vary the thickness of the depletion layers in the first and second semiconductor means to thereby vary the distributed capacity in said first and second filter area and vary the frequency response characteristics of said first and second filter areas.

References Cited in the file of this patent

UNITED STATES PATENTS

| | | |
|---|---|---|
| 2,078,762 | Holst | Apr. 27, 1937 |
| 2,433,771 | Lindenberg | Dec. 30, 1947 |
| 2,559,662 | Rheingold | July 10, 1951 |
| 2,816,228 | Johnson | Dec. 10, 1957 |
| 2,898,457 | Auerbach | Aug. 4, 1959 |